United States Patent
Koifman et al.

[11] Patent Number: 5,760,726
[45] Date of Patent: Jun. 2, 1998

[54] DIGITAL-TO-ANALOG CONVERTER WITH DYNAMIC MATCHING AND BIT SPLITTING

[75] Inventors: Vladimir Koifman, Rishon-Lezion; Yachin Afek, Kfar Saba, both of Israel

[73] Assignee: Motorola, Inc., Schaumburg, Ill.

[21] Appl. No.: 689,622

[22] Filed: Aug. 23, 1996

[51] Int. Cl.[6] .................................................. H03M 1/68
[52] U.S. Cl. ........................................... 341/145; 341/144
[58] Field of Search ................................. 341/133, 135, 341/136, 145, 147, 144

[56] References Cited

U.S. PATENT DOCUMENTS

| | | | |
|---|---|---|---|
| 4,791,406 | 12/1988 | Mehrgardt et al. | 341/144 |
| 4,864,215 | 9/1989 | Schouwenaars et al. | 323/312 |
| 4,873,525 | 10/1989 | Iida | 341/145 |
| 4,935,740 | 6/1990 | Schouwenhaars et al. | 341/135 |
| 4,935,741 | 6/1990 | Reich | 341/150 |
| 4,973,979 | 11/1990 | Ikeda | 341/154 |
| 4,998,108 | 3/1991 | Ginthner et al. | 341/145 |
| 5,021,784 | 6/1991 | Groeneveld et al. | 341/120 |
| 5,036,322 | 7/1991 | Barrow et al. | 341/144 |
| 5,084,701 | 1/1992 | Sauerwald | 341/118 |
| 5,138,317 | 8/1992 | Story | 341/144 |
| 5,243,347 | 9/1993 | Jackson | 341/144 |
| 5,283,580 | 2/1994 | Brooks et al. | 341/145 |
| 5,305,004 | 4/1994 | Fattaruso et al. | 341/120 |
| 5,406,283 | 4/1995 | Leung | 341/143 |
| 5,412,335 | 5/1995 | Jackson et al. | 327/552 |
| 5,420,584 | 5/1995 | Norsworthy | 341/110 |
| 5,442,353 | 8/1995 | Jackson | 341/143 |
| 5,446,455 | 8/1995 | Brooks | 341/145 |
| 5,642,116 | 6/1997 | Gersbach | 341/120 |

*Primary Examiner*—Marc S. Hoff
*Attorney, Agent, or Firm*—Robert M. Handy

[57] ABSTRACT

A digital-to-analog (D/A) converter (400) receives a N bit digital signal $S_N$ by a signal divider (440) which divides it into digital group signals $S_{Nk}$. In converter blocks ($401_k$), these digital group signals $S_{Nk}$ are then separately converted into analog group signals $S_{Gk}$. In a summation circuit (460) these analog group signals $S_{Gk}$ are combined to the analog signal $S_A$. The converter blocks ($401_k$) can comprise banks ($430_k$) with, e.g., current sources whose currents $I_i$ are combined into the analog group signal $S_{Gk}$ selectively according to the digital group signal $S_{Nk}$. The converter blocks ($401_k$) can include circuits to equalize component variations, such as dynamic matching circuits ($480_k$). The converter blocks ($401_k$) can be configured according to the significance of the digital group signals $S_{Nk}$ and the hardware can be optimized.

11 Claims, 9 Drawing Sheets

DIGITAL-TO-ANALOG CONVERTER WITH DYNAMIC MATCHING AND BIT SPLITTING

FIELD OF THE INVENTION

This invention generally relates to data conversion circuits and data conversion methods, and more specifically to integrated digital-to-analog converters (DAC) and to digital-to-analog (D/A) conversion methods.

BACKGROUND OF THE INVENTION

There is a variety of known DACs which transform a digital signal $S_N$ into an analog signal $S_A$. The digital signal $S_N$ consists of N bits which can be supplied to the DAC in parallel or serially. The analog signal $S_A$ is usually a voltage, a current, or a charge; but it can have any other form. The digital signal $S_N$ has a numerical value v which represents the analog signal $S_A$. The numerical value v has no dimension.

For convenience, it is assumed that the digital signal $S_N$ changes every sample time $T_S$ and that it is converted into an analog signal $S_A$ in a $T_S$ long conversion cycle.

A current DAC has n current sources providing predefined currents $I_i$ (i=0 ... n−1). The analog signal $S_A$ is generated by combining these currents according to the digital signal $S_N$. In binary weighted DACs, the current sources provide currents $I_i$ which have binary two multiple values ($I_i=I_{i-1}*2$). In monotonic DACs, the current sources provide substantially equal currents $I_i$. In general, the analog signal $S_A$ can also be composed by other sources, such as, for example, capacitors as charge sources.

The accuracy of a DAC and of a D/A conversion depends among others on the number N of bits of the digital signal $S_N$. Manufacturing variations due to, for example, limitations in lithographic resolution lead to component mismatches.

FIG. 1 shows the current distribution of i=0 ... n−1 current sources with substantially equal currents $I_i$. The current I is plotted on the vertical axis, and the ordinal number i is plotted on the horizontal axis. All currents $I_i$ are inside a technology dependent tolerance band $I_{max}-I_{min}$. For convenience of explanation, a rated current $I_R$ is defined as $I_R=(I_{max}-I_{min})/2$. The reference $I_{AV}$ denotes the average current $I_{AV}=(I_0+I_1+ ... +I_{n-1})/n$ for all current sources. Differences between $I_{AV}$ and $I_R$ can lead to a DC offset in the analog signal $S_A$.

Current source i generates a current $I_i$ which differs from the rated current $I_R$ by a current error $\Delta I_i$. Adjacent current sources i and i+1 can have a mismatch $I_i-I_{i+1}$.

For example, variations in current sources can be caused by their position in different places on a substrate. Variations can be distributed at random and described by a Gaussian distribution. The variations can also be linearly depending on other conditions, as for example, $I_i$ can vary across adjacent current sources due to the aligned positioning on the substrate. The linear increase or decrease can be defined by a linear gradient g as $I_i=I_{i-1}*g$ or $I_k=I_i*g*(k-i)$. There is always a superposition of linear and random variations.

Due to the variations, the analog signal $S_A$ of a non-ideal DAC can not represent the exact numerical value v of the digital signal $S_N$. It can also contain noise resulting from, for example, the quantization.

For a given technology with inherent variations it is always desirable to find ways to construct DACs so that the precision can be increased. There are many strategies to compensate variations such as sigma-delta conversion, self-calibration, trimming of components, digital error correction and dynamic matching. Every strategy requires special hardware arrangements demanding substrate space, increasing power dissipation or eventually lowering the D/A conversion speed. Examples of prior art approaches are described in U.S. Pat. Nos. 5,406,283-Bosco Leung; 5,138,317-Story; 4,791,406-Mehrgardt; 4,935,740-Schouvenhaars; 5,305,004-Fattaruso; and 5,243,347-Jackson.

Increasing accuracy demands for converters lead to a increasing number of their elements (current sources, switches, register). The task is to find an optimized hardware design for a required degree of accuracy and a given technology.

The invention is aimed to provide an improved DAC architecture and an improved D/A conversion method that reduces or overcomes the above mentioned problems of prior art.

SUMMARY OF THE INVENTION

The objects of the invention are solved basically by applying the features laid down in the independent claims. Further preferred embodiments of the invention are given in the dependent claims.

The invention allows to design a DAC which separates the digital signal $S_N$ at the input into digital group signals $S_{Nk}$, transfers them into analog group signals $S_{Gk}$ in different ways and supplies at the output the analog signal $S_A$ as a combination of the analog group signals $S_{Gk}$.

The DAC can be optimized by selecting conversion methods and circuits for each digital group signal $S_{Nk}$ which are appropriate for the desired accuracy level. It is possible to reduce hardware by configuring the comparator according to the accuracy demands of the application.

Errors resulting from component mismatch can be reduced by the optional use of dynamic matching circuits. The bit permutations generated in such circuits can equalize manufacturing differences between components.

DETAILED DESCRIPTION OF A PREFERRED EMBODIMENT

In the following, the word 'converter' is used for a digital-to-analog converter (DAC).

Figure 1:
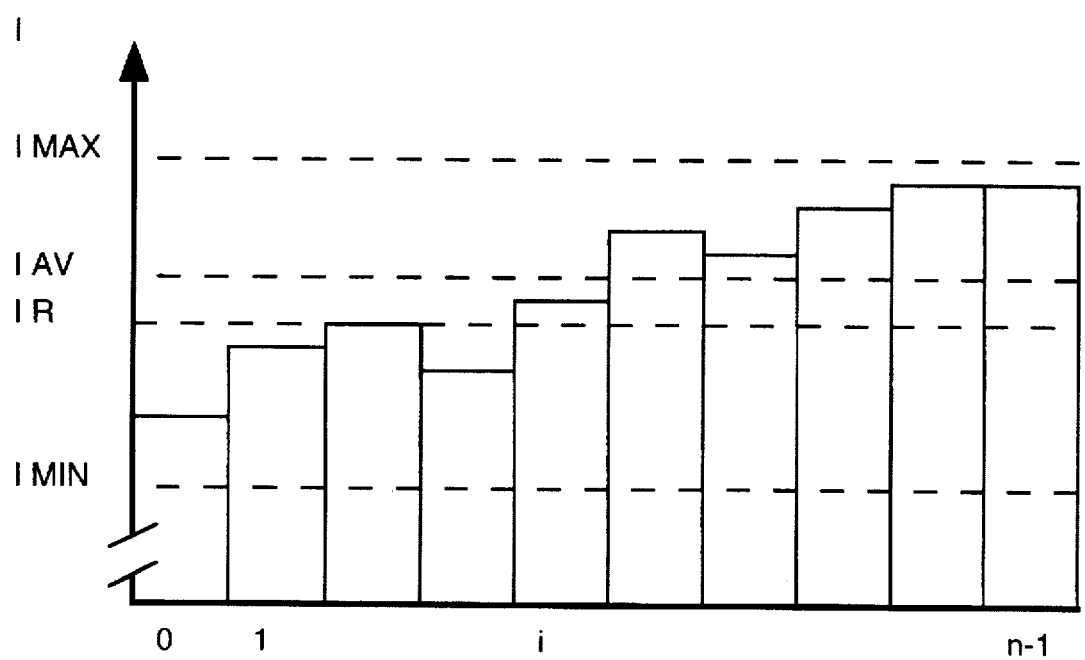
FIG. 1 shows the current distribution of a plurality of current sources with substantially equal currents.
Figure 2:
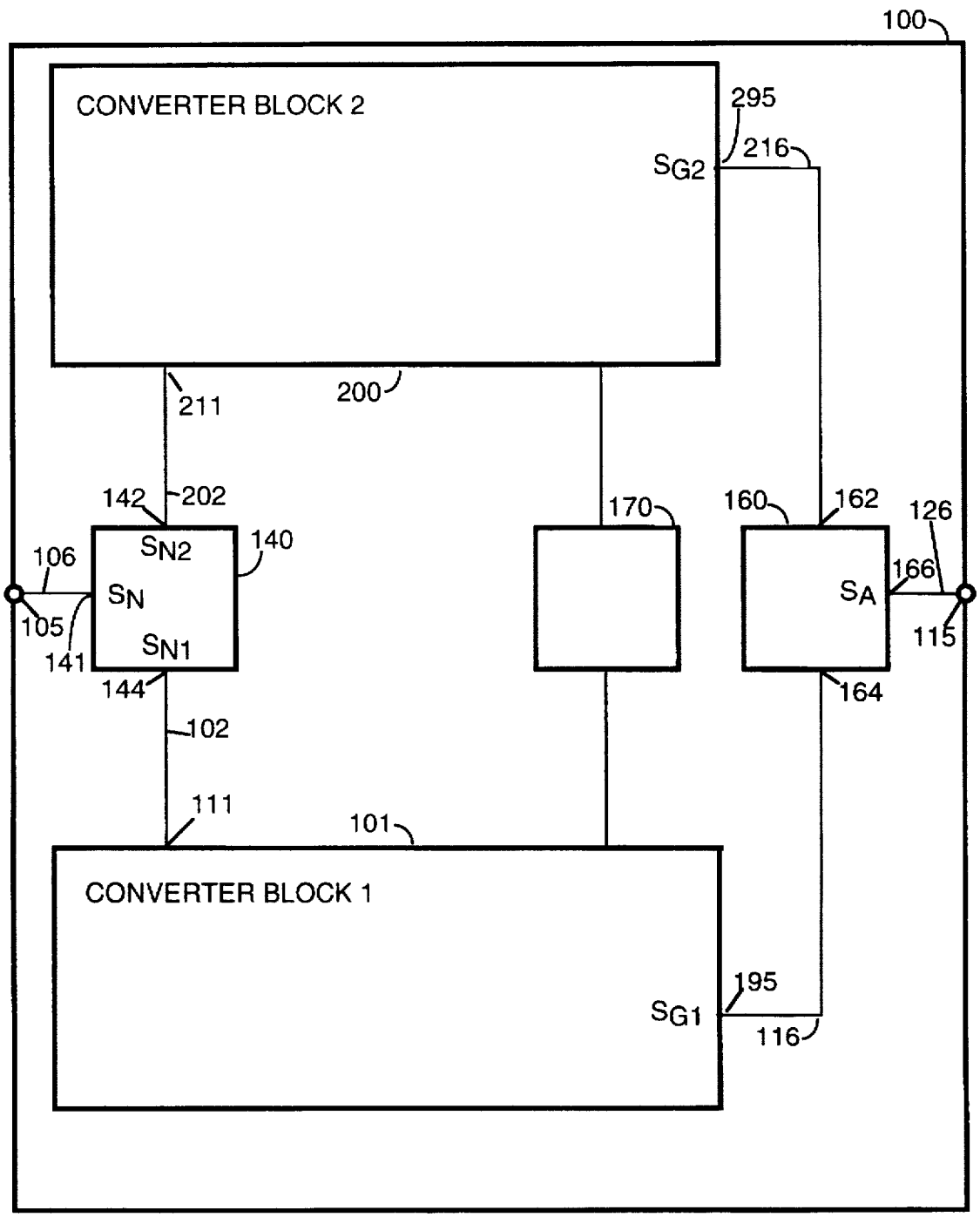
FIG. 2 shows a schematic block diagram of a DAC (100) according to the present invention.

FIG. 2 shows a schematic block diagram of converter 100 according to the present invention. Converter 100 comprises signal divider 140, a first converter block 101 and a second converter block 200, summation circuit 160, and optional reference circuit 170. Input terminal 105 is provided to supply digital signal $S_N$ (106). Output terminal 115 is provided to supply analog signal $S_A$ (126).

Input terminal 105 is coupled to signal divider 140 via input 141. Outputs 144, 142 of signal divider 140 are coupled to inputs 111, 211 of converter blocks 101 and 200, respectively. Outputs 195, 295 of converter blocks 101 and 200 are coupled to inputs 164, 162 of summation circuit 160 which is at output 166 coupled to output terminal 115. Optional reference circuit 170 can be coupled both to converter block 101 or to converter block 200.

Construction and function of a best mode embodiment of converter blocks 101, 200 will be explained below in reference to FIG. 3 and FIG. 4.

The operation of converter 100 is as follows: Digital signal $S_N$ (106) has $N=N_1+N_2$ bits: $N_1$ bits are the least significant bits (LSB) and $N_2$ bits are the most significant bits (MSB). Every sample time $T_S$, digital signal $S_N$ is supplied to signal divider 140 where it is separated into digital group signal $S_{N1}$ (102) comprising LSB and digital group signal $S_{N2}$ (202) comprising MSB. Digital group signals $S_{N1}$ and $S_{N2}$ are supplied to converter block 101 and 200, respectively, where analog group signals $S_{G1}$ for LSB and $S_{G2}$ for MSB are generated. Analog group signals $S_{G1}$ and $S_{G2}$ are the analog equivalents of digital group signals $S_{N1}$ and $S_{N2}$ and can be, as for a current converter, sum currents $I_{S1}$ for LSB and $I_{S2}$ for MSB.

In summation circuit 160, the analog group signals $S_{G1}$ and $S_{G2}$ are combined. Summation circuit 160 can be implemented as a node to add the sum currents $I_{S1}$ and $I_{S2}$ to $I_{TOTAL}=I_{S1}+I_{S2}$ which is the analog equivalent of the digital signal $S_N$. Current $I_{TOTAL}$ can be send as analog signal $S_A$ (126) to output terminal 115.

In addition, summation circuit 160 can comprise a current-to-voltage transformer. As a consequence, in this case the analog signal $S_A$ is a voltage $V_{out}$.

Figure 3:
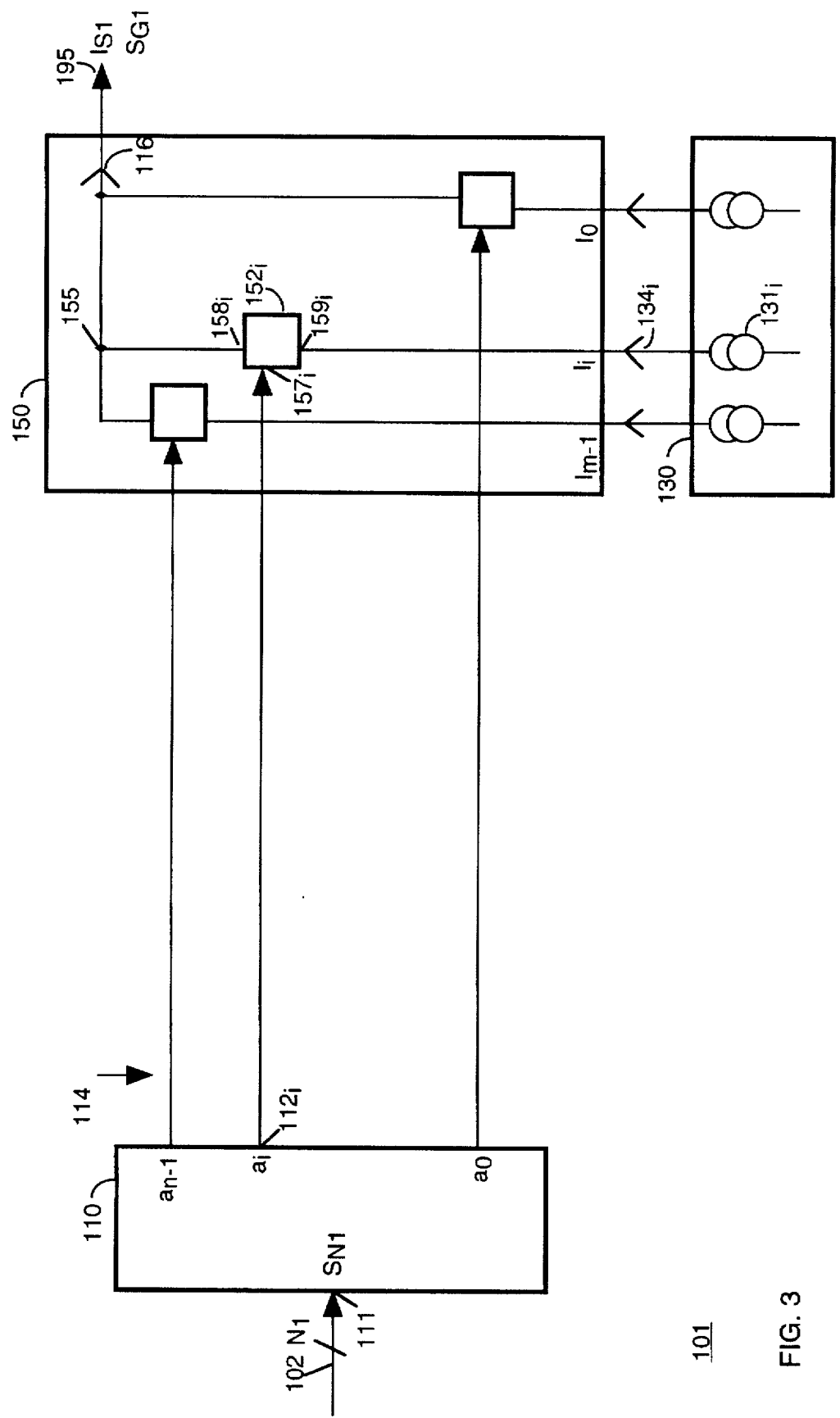
FIG. 3 shows a schematic block diagram of the best mode embodiment of the first converter block (101) implemented in the DAC of FIG. 2.

FIG. 3 shows a schematic block diagram of converter block 101.

Converter block 101 comprises code converter 110, bank 130 of current sources $131_i$, and steering circuit 150. Input 111 is provided at code converter 110 to read $N_1$ bit digital group signal $S_{N1}$ (102). Output 195 is provided at steering circuit 150 to supply sum current $I_{S1}$ (116) which is the analog group signal $S_{G1}$. The D/A conversion takes place every sample time $T_S$.

Digital group signal $S_{N1}$ has a numerical value $v_1$ coded by an $N_1$ bit binary code. Code converter 110 is provided for converting digital group signal $S_{N1}$ into a thermometer code signal $S_{TC}$ (114). A thermometer code signal $S_{TC}$ has n bits. A number of v bits is in a first binary condition, e.g. '1', and n−v bits are in a second binary condition, e.g. '0'.

For example, a digital group signal $S_{N1}$ having numeric value v=9 can be coded by the binary code '1001' (4 bit) or by the thermometer code '1111 1111 1000 0000' (16 bit). With increasing numerical value v, the band of '1' bits is getting broader. This is like the rising mercury column of a thermometer. The n bits of thermometer code signal $S_{TC}$ are called code bits $a_0, a_i \ldots a_{n-1}$ and available at n outputs $112_i$. The maximum numerical value $v_{max}$ equals $2^N-1$.

Bank 130 with n current sources $131_i$ is provided for supplying predetermined currents $I_i$ ($134_i$). In the example, all rated currents $I_{Ri}$ are equal. It is possible to couple bank 130 to reference circuit 170 for receiving reference currents $I_{Ref}$. As explained above, currents $I_i$ are different among themselves due to production variations for current sources $131_i$.

Steering circuit 150 comprises n switches $152_i$ and node 155. Each switch $152_i$ has main terminals $158_i$, $159_i$ and switch input $157_i$. Current sources $131_i$ of bank 130 are coupled via main terminals $158_i$, $159_i$ of switches $152_i$ to node 155 where they are added to sum current $I_S$ (116).

Code converter 110 is coupled via outputs $112_i$ to control inputs $157_i$ of switches $152_i$.

The function of converter block 101 is now explained.

All code bits $a_i$ of thermometer code signal $S_{TC}$ are sent to switch inputs $157_i$ of switches $152_i$. Assuming positive logic, code bits $a_i$ in '1' condition cause switches $152_i$ to connect current sources $131_i$ to node 155. Sum current $I_{S1}$ (116) is the sum of all currents $I_i$ which are activated by code bits $a_i$ and corresponds to digital signal $S_{N1}$. Sum current $I_{S1}$ is send to output 195 as analog group signal $S_{G1}$.

Figure 4:
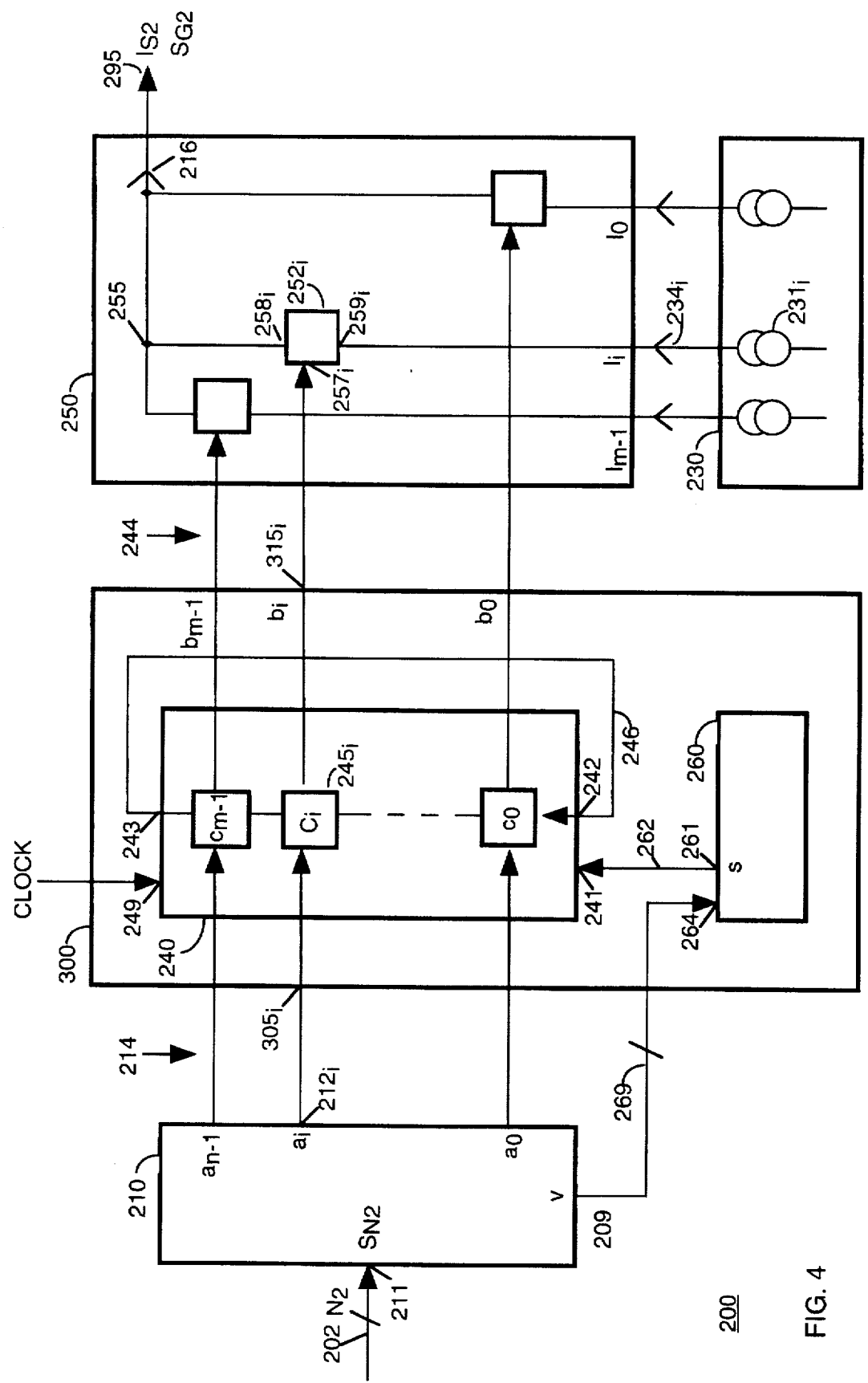
FIG. 4 shows a schematic block diagram of the best mode embodiment of the second converter block (200) implemented in the DAC of FIG. 2.

FIG. 4 shows a schematic block diagram of converter block 200. Converter block 200 comprises code converter 210, bank 230 of current sources $231_i$, steering circuit 250, and dynamic matching circuit 300. Input 211 is provided at code converter 210 to read $N_2$ bit digital signal $S_{N2}$ (202). Output 295 is provided at steering circuit 250 to supply sum current $I_{S2}$ (216). The D/A conversion takes place every sample time $T_S$.

Code converter 210 has n outputs $212_i$ for supplying thermometer code signal $S_{TC}$ (214) of n code bits $a_0, a_i \ldots a_{n-1}$. Usually, n equals $2^N$. Code converter 210 is similar to code converter 110, but it can have control output 209 for providing numerical value v.

As shown in FIG. 4, dynamic matching circuit 300 comprises shift register 240 and auxiliary register 260. At shift register 240, dynamic matching circuit 300 has n inputs $305_i$ for receiving n bits and m outputs $315_i$ for supplying m bits. In the example shown in FIG. 4, n equals m. Dynamic matching circuit 300 can be replaced by a different circuit comprising other units. That will be explained in connection with FIG. 9. As a person skilled in the art will understand, dynamic matching circuit 300 can comprise additional means for storing bits, such as flip-flop registers.

Shift register 240 receives thermometer code signal $S_{TC}$ (214) via inputs $305_i$. Shift register 240 has m storage cells $c_0, c_i \ldots c_{m-1}$ ($245_i$) which are coupled to outputs $315_i$. Every storage cell $c_i$ ($245_i$) can store one bit of information.

Shift register 240 can further comprise clock input 249 for receiving a clock signal CLOCK having a clock frequency $f_{CLOCK}=r/T_S$ with r being an integer. Shifting the bits of all storage cells $c_i$ by one step (bit of $c_i$ to $c_{i+1}$) requires a clock time $1/f_{CLOCK}$. The bit in storage cell $c_i$ can be either a code bit $a_i$ or, as it will be explained, a control bit $b_i$. For shifting bits, adjacent storage cells $c_i$ and $c_{i+1}$ as well as $c_{m-1}$ and $c_0$ are coupled. In FIG. 4, that connection is indicated by link 246 between serial output 243 at $c_{m-1}$ and serial input 242 at $c_0$. Shift register 240 also comprises control input 241 to read a shift integer s. Control signal $S_C$ (244) is available at outputs $315_i$. Control signal $S_C$ (244) has m control bits $b_0, b_i \ldots b_{m-1}$.

Auxiliary register 260 is provided to store and calculate shift integer s. It has input 264 for reading the numerical value v (269) and output 261 for supplying shift integer s (262). For example, auxiliary register 260 can be an incremental counter which resets to zero upon reaching the highest number $s_{max}$.

The function and the elements of bank 230 and steering circuit 250 are similar to that of bank 130 and steering circuit 150 of FIG. 3. Reference numerals 130/230, 131/231, 134/234, 150/250, 155/255, 152/252, 157/257, 158/258, 159/259 denote corresponding components. A difference can exist in the number of elements. In converter block 200, the number m of current sources $231_i$ and switches $252_i$ equals the number of outputs of dynamic matching circuit 300.

Code converter 210 is coupled via n outputs $212_i$ to n inputs $305_i$ of dynamic matching circuit 300.

In dynamic matching circuit 300, output 261 of auxiliary register 260 is coupled to control input 241 of shift register 240. Input 264 of auxiliary register 260 can be coupled to control output 209 of code converter 210.

Dynamic matching circuit 300 is coupled to switches $252_i$ of steering circuit 250 via outputs $315_i$ and control inputs $257_i$.

Figure 5:
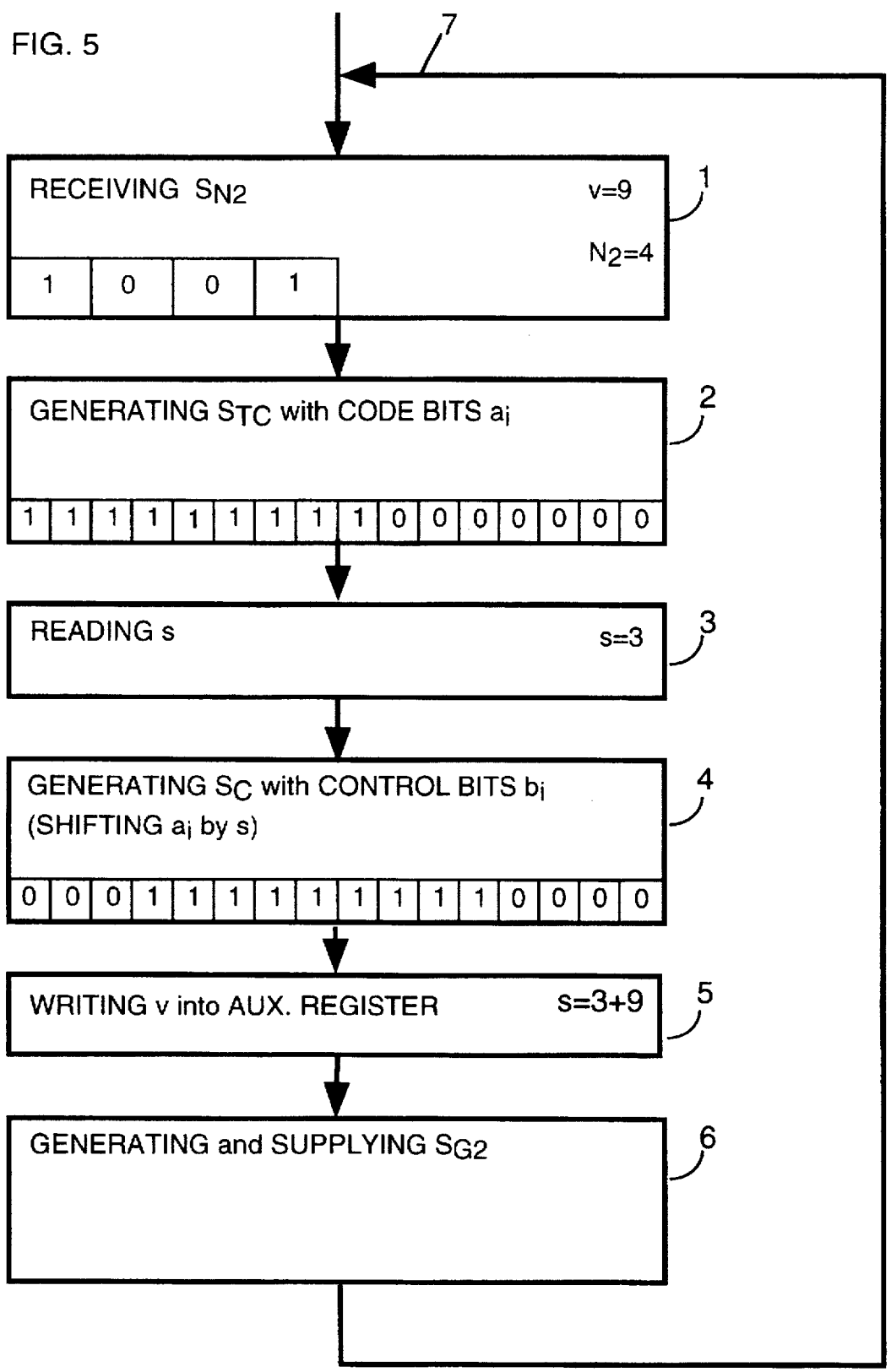
FIG. 5 shows a flow-chart explaining the function of the second converter block (200) of FIG. 4.

The function of converter block 200 and especially the function of dynamic matching circuit 300 are now explained. The functional steps are also shown in the flowchart of FIG. 5. The values v=9, s=3, and $N_2$=4 are examples and given only for illustration.

1. Digital signal $S_{N2}$ (202) representing the numerical value v is received by code converter 210 via input 211. Numerical value v is, for example, coded by an $N_2$ bit binary code. The maximum numerical value $v_{max}$ equals $2^{N2}-1$.

2. Code converter 210 converts digital signal $S_{N2}$ into thermometer code signal $S_{TC}$ (214) having code bits $a_0, a_i ... a_{n-1}$. Thermometer code signal $S_{TC}$ (214) is supplied to storage cells $c_i$ ($245_i$) of shift register 240. The status of storage cells $c_i$ equals code bits $a_i$. Therefore storage cells $c_0 ... c_{v-1}$ are '1' and storage cells $c_v ... c_m$ are '0'. Storage cells $c_i$ for i>n are also '0'. The number of '1' storage cells $c_i$ is v.

3. Shift register 240 reads shift integer s from auxiliary register 260.

4. The bit status of storage cells $c_i$ is shifted by s in one direction. The bit status of storage cell $c_{m-1}$ is transferred to storage cell $c_0$ via link 246. In that way, control signal $S_C$ (244) with control bits $b_0, b_i ... b_{m-1}$ is generated. The status of storage cells $c_i$ equals control bits $b_i$. When an '1' condition was transferred from storage cell $c_{m-1}$ to $c_0$ then control bits $b_{s+v-m} ... b_{s-1}$ and $b_s ... b_{m-1}$ are '0' and the others are '1'. When an '1' was not transferred from storage cell $c_{m-1}$ then control bits $b_s ... b_{s+v-1}$ are '1' and the others are '0'. The number of storage cells $c_i$ in '1' condition remains v. The time required for shifting is $s/f_{CLOCK}$.

5. Numerical value v is sent to auxiliary register 260 and added to shift integer s. In case s+v=m or s+v>m, m is subtracted. The new shift integer s then equals s+v or s+v-m.

6. All control bits $b_i$ of control signal $S_C$ (244) are sent to switch inputs $257_i$ of switches $252_i$. Control bits $b_i$ in '1' condition cause switches $252_i$ to connect current sources $231_i$ to node 255. Sum current $I_{S2}$ (216) is the sum of all currents $I_i$ which are activated by control bits $b_i$ and corresponds to digital signal $S_{N2}$ (202). Sum current $I_{S2}$ which is analog group signal $S_{G2}$ is send to output 295.

7. Converter block is now ready to receive the next digital signal $S_{N2}$.

For convenience of explanation and not intended to be limiting, TABLE 1 shows, as an example, the bit status of shift register 240 with m=16 storage cells $c_i$ during the D/A conversion of a digital signal $S_N$ with changing numerical value $v_k$. Index i for storage cells $c_i$ is indicated by hexadecimal numbers from 0 to F. For a certain moment, each storage cell $c_i$ has one binary condition '0' or '1'. In the example, n equals m. Thermometer code signal $S_{TC}$ (214) is indicated by code bits $a_i$. Control signal $S_C$ (244) is indicated by control bits $b_i$. K is a counter for the steps, $v_k$ the numerical value of digital signal 202 at STEP k, and $s_k$ is the shift integer. Auxiliary register 260 is an incremental counter with $s_{max}$=m-1.

TABLE 1

| k | $v_k$ | $s_k$ | i | 0 | 1 | 2 | 3 | 4 | 5 | 6 | 7 | 8 | 9 | A | B | C | D | E | F |
|---|---|---|---|---|---|---|---|---|---|---|---|---|---|---|---|---|---|---|---|
| 1 | 3 | 0 | $a_i$ | 1 | 1 | 1 | 0 | 0 | 0 | 0 | 0 | 0 | 0 | 0 | 0 | 0 | 0 | 0 | 0 |
|   |   |   | $b_i$ | 1 | 1 | 1 | 0 | 0 | 0 | 0 | 0 | 0 | 0 | 0 | 0 | 0 | 0 | 0 | 0 |
| 2 | 8 | 3 | $a_i$ | 1 | 1 | 1 | 1 | 1 | 1 | 1 | 1 | 0 | 0 | 0 | 0 | 0 | 0 | 0 | 0 |
|   |   |   | $b_i$ | 0 | 0 | 0 | 1 | 1 | 1 | 1 | 1 | 1 | 1 | 1 | 0 | 0 | 0 | 0 | 0 |
| 3 | 10 | 11 | $a_i$ | 1 | 1 | 1 | 1 | 1 | 1 | 1 | 1 | 1 | 1 | 0 | 0 | 0 | 0 | 0 | 0 |
|   |   |   | $b_i$ | 1 | 1 | 1 | 1 | 1 | 0 | 0 | 0 | 0 | 0 | 1 | 1 | 1 | 1 | 1 | 1 |
| 4 | 3 | 5 | $a_i$ | 1 | 1 | 1 | 0 | 0 | 0 | 0 | 0 | 0 | 0 | 0 | 0 | 0 | 0 | 0 | 0 |
|   |   |   | $b_i$ | 0 | 0 | 0 | 0 | 0 | 1 | 1 | 1 | 0 | 0 | 0 | 0 | 0 | 0 | 0 | 0 |

In STEP k=1 code bits $a_i$ representing numerical value $v_1$=3 are supplied to storage cells $c_i$. Shift integer $s_1$ equals zero, so that there is no bit shifting. The bits are supplied to steering circuit 250 as unchanged control bits $b_i$. Sum current $I_S$ equals $I_S=I_0+I_1+I_2$. Numerical value $v_1$=3 is added to shift integer $s_1$=0 which becomes $s_2$=3 for STEP k=2. The current error caused by manufacturing variations is $\Delta I_0 + \Delta I_1 + \Delta I_2$.

In STEP k=2 the code bits $a_i$ represent the numerical value $v_2$=8. $v_2$=8 storage cells $c_i$ are in '1', m-$v_2$=16-8=8 are '0'. The bits are shifted by $s_2$=3. Shift integer $s_2$ is then increased by $v_2$=8 to $s_3$=11. Control bits $b_0$, $b_1$, $b_2$ are '0', the following $b_3$ to $b_{10}$ are '1', and the remaining ones are '0'. Sum current $I_S$ equals $I_S=I_3+ ... +I_{10}$.

In STEP k=3, $S_3+v_3$ exceed m=16 so that the '1' status of storage cell $c_{m-1}=c_{15}$ is transferred to $c_0$. The number of control bits in status '1' equals $v_3$=10. Here, control bits $b_0$ to $b_4$ and $b_{11}$ to $b_{15}$ are '1', the other control bits are '0'. In auxiliary register 260, shift integer $s_4$ is calculated as $v_3+s_3$−m=10+11−16=5.

In STEP k=4, digital signal $S_N$ has the same numerical value $v_4$=3 as in STEP k=1. The current error caused by manufacturing variations is $\Delta I_5 + \Delta I_6 + \Delta I_7$ which is different from that in STEP k=1.

For every D/A conversion, the maximum number of shifting is given by $s_{max}$. There is a certain time required which can limit the working frequency of the converter.

It is also possible to simplify the schematics by using a fixed shift integer $s_{fix}$ which can be, for example, $s_{fix}$=1. In such a case, auxiliary register 260 becomes superfluous. The bit status of shift register 240 during an assumed D/A conversion is given in TABLE 2.

TABLE 2

| k | $v_k$ | $s_k$ | | i 0 | 1 | 2 | 3 | 4 | 5 | 6 | 7 | 8 | 9 | A | B | C | D | E | F |
|---|---|---|---|---|---|---|---|---|---|---|---|---|---|---|---|---|---|---|---|
| 1 | 3 | 0 | $a_i$ | 1 | 1 | 1 | 0 | 0 | 0 | 0 | 0 | 0 | 0 | 0 | 0 | 0 | 0 | 0 | 0 |
|   |   |   | $b_i$ | 1 | 1 | 1 | 0 | 0 | 0 | 0 | 0 | 0 | 0 | 0 | 0 | 0 | 0 | 0 | 0 |
| 2 | 8 | 1 | $a_i$ | 1 | 1 | 1 | 1 | 1 | 1 | 1 | 1 | 0 | 0 | 0 | 0 | 0 | 0 | 0 | 0 |
|   |   |   | $b_i$ | 0 | 1 | 1 | 1 | 1 | 1 | 1 | 1 | 1 | 0 | 0 | 0 | 0 | 0 | 0 | 0 |
| 3 | 10 | 2 | $a_i$ | 1 | 1 | 1 | 1 | 1 | 1 | 1 | 1 | 1 | 1 | 0 | 0 | 0 | 0 | 0 | 0 |
|   |   |   | $b_i$ | 0 | 0 | 1 | 1 | 1 | 1 | 1 | 1 | 1 | 1 | 1 | 1 | 0 | 0 | 0 | 0 |
| 4 | 3 | 1 | $a_i$ | 1 | 1 | 1 | 0 | 0 | 0 | 0 | 0 | 0 | 0 | 0 | 0 | 0 | 0 | 0 | 0 |
|   |   |   | $b_i$ | 0 | 0 | 0 | 1 | 1 | 1 | 0 | 0 | 0 | 0 | 0 | 0 | 0 | 0 | 0 | 0 |

In this case, the shifting requires only one clock time $1/f_{CLOCK}$.

The explanations are based on the assumption that the permutation of code bits $a_i$ to control bits $b_i$ takes place every sample time $T_S$. In this case, dynamic matching circuit 300 operates at a clock frequency $f_{CLOCK}=1/T_S$. However, it is possible to run dynamic matching circuit 300 at a higher clock frequency $f_{CLOCK}=r/T_S$, with r being an integer. That means in a $T_S$ long conversion cycle r slightly different sum currents $I_S$ are generated.

In dynamic matching circuit 300 of converter 200, it is also possible to replace shift register 240 by a barrel shifter having n inputs and m outputs. A barrel shifter performs a direct shifting by shift integer s at one clock time $1/f_{CLOCK}$. Therefore, the operation speed of dynamic matching circuit 300 can be increased.

Dynamic matching circuits 300 converts a thermometer code signal $S_{TC}$ into a control signal $S_C$. The bit configuration of control signal $S_C$ is a permutation of the thermometer code signal $S_{TC}$. Manufacturing variations can be averaged out by these permutations. All sum currents $I_S$ represent as analog group signal $S_{G2}$ the numerical value of the digital group signal $S_{N2}$.

Converter 100 had been implemented as a DAC with 10 bit resolution. In signal divider 140, the digital signal $S_N$ is split up into a $N_1=5$ bit digital group signal $S_{G1}$ (LSB) and a $N_2=5$ digital group signal $S_{G2}$ (MSB). Reference circuit 170 provides reference currents $I_{Ref1}$ for bank 130 of converter block 101 and $I_{Ref2}$ for bank 230 of converter block 200. $I_{Ref2}$ is $2^5=32$ times higher than $I_{Ref1}$. The digital signal $S_N$ at the input changes every sample time $T_S=5$ μs. MSB bits are converted in converter block 200. Dynamic matching circuit 300 of converter block 200 averages current differences ΔI by a r=64 clock frequency $f_{CLOCK}=6.4$ MHz. Summation circuit 160 further comprises an operational amplifier with a unity gain frequency of 0.2 MHz. Converter 100 can achieve a 10-bit resolution with current sources 234, 134 having a variation of current $I_i$ to rated current $I_R$ of 3%.

Converter 100 has been optimized by selecting appropriate D/A conversion methods and circuits for most and least significant bits. Dynamic matching circuit 300 is only used in converter block 200 (MSB). The accuracy requirements for converter block 101 (LSB) are less severe, so that no dynamic matching circuit is used.

As explained in connection with FIG. 2, the digital signal $S_N$ can be separated into digital group signal $S_{N1}$ for LSB and digital group signal $S_{N2}$ for MSB and converted into two analog group signals $S_{G1}$ and $S_{G2}$ separately. It is also possible to split up the N bits digital signal $S_N$ into more digital group signals $S_{Nk}$.

For further explanations, the following definitions are given: The digital signal $S_N$ has a number of N bits $w_0, w_i, \ldots w_{N-1}$ (count index i). It can be divided into G digital group signals $S_{Nk}$ (count index k). Every digital group signal $S_{Nk}$ has Nk group bits $g_0, g_i \ldots g_{Nk-1}$ (count index i). The total number of group bits $g_i$ equals $N_1+N_k+\ldots+N_G=N$. Every digital group signal $S_{Nk}$ represents a numerical value $v_{Nk}$. It is also possible to code a polarity sign in a digital group signal $S_{Nk}$. The numerical values $v_{Nk}$ of all digital group signals $S_{Nk}$ represent the analog signal $S_A$.

Figure 6:
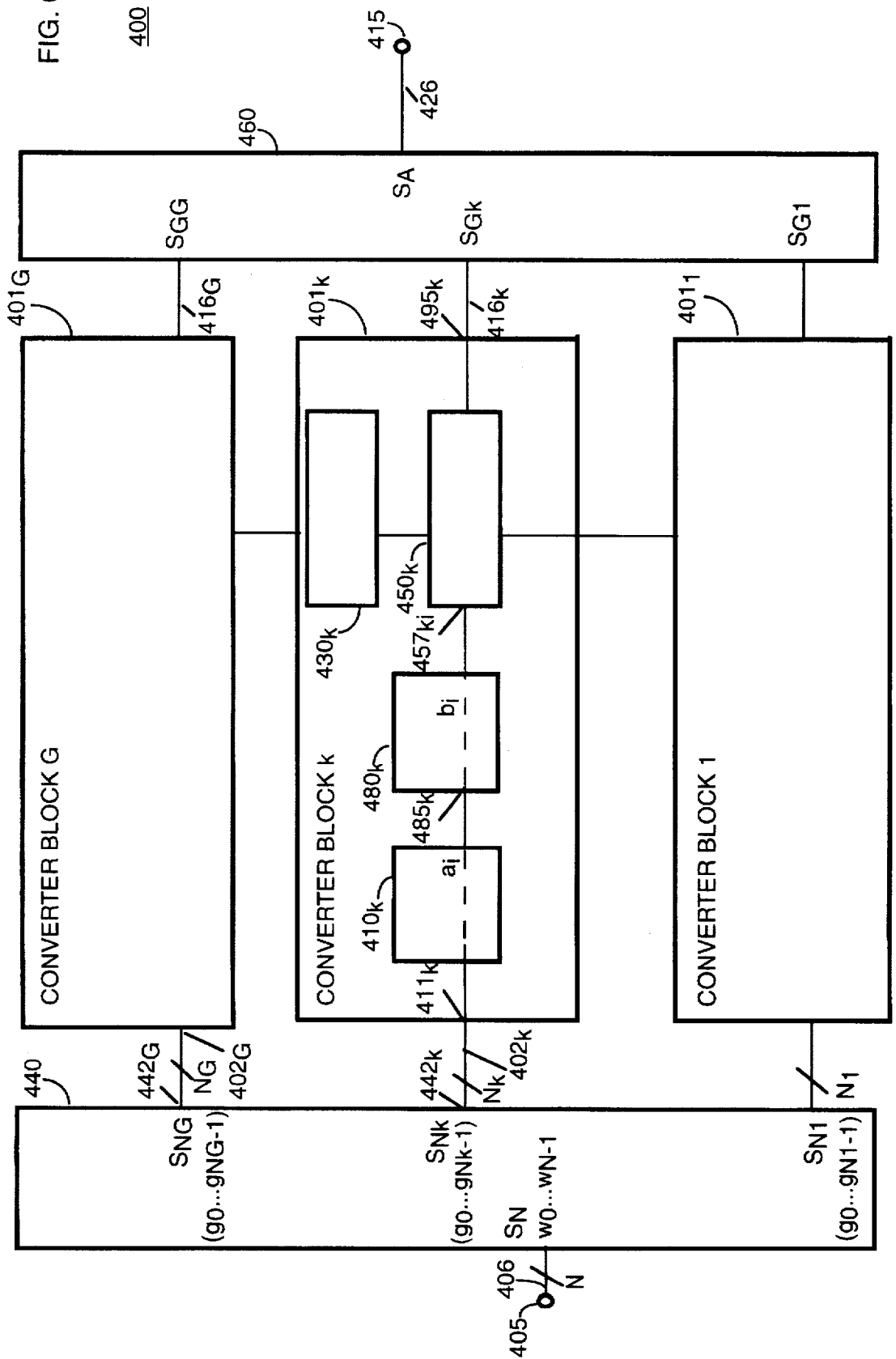
FIG. 6 shows a schematic block diagram of an embodiment of the present invention wherein the DAC comprises several converter blocks ($401_k$)

FIG. 6 shows a simplified schematic diagram of converter 400 which comprises signal divider 440, a group of G converter blocks $401_k$, and summation circuit 460. Input terminal 405 is provided for supplying digital signal $S_N$ (406), output terminal 415 for supplying analog signal $S_A$ (426). Signal divider 440 has G outputs $442_k$ for every digital group signal $S_{Nk}$.

Figure 7:
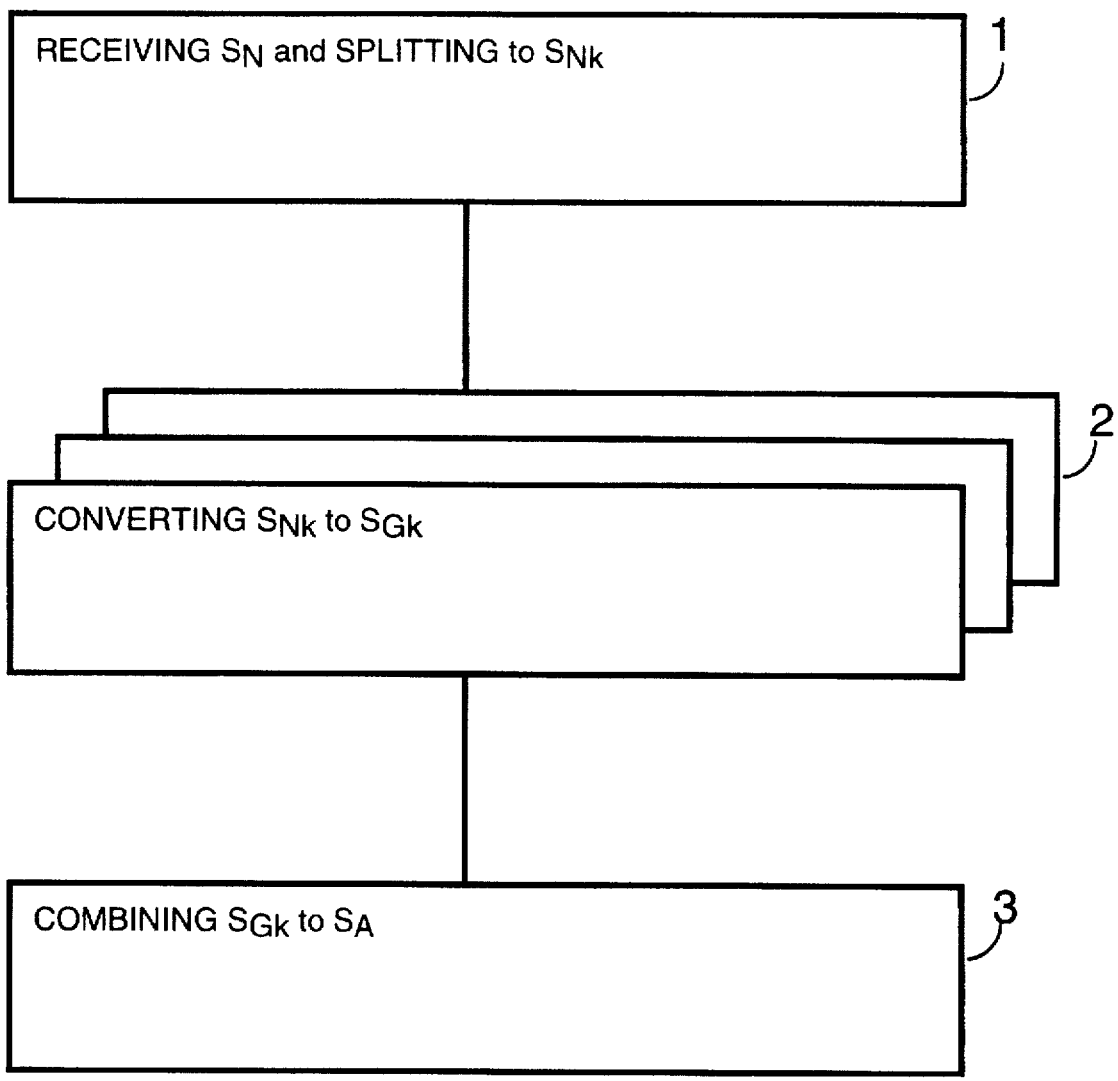
FIG. 7 shows a flow-chart of the D/A conversion method of the present invention.

The D/A conversion comprises the following steps also shown in the flow-chart of FIG. 7;

1. Signal divider 440 receives the digital signal $S_N$ and splits it up into the digital group signals $S_{Nk}$.
2. Converter block $401_k$ converts the digital group signal $S_{Nk}$ at input $411_k$ into a corresponding analog group signal $S_{Gk}$ at output $495_k$. For example, the analog group signal $S_{Gk}$ can be sum current $I_{Sk}$. The conversion for other digital group signals $S_{Nx}$ takes place simultaneously in the other converter blocks $401_x$. In FIG. 7, this is indicated by overlapping boxes.
3. In summation circuit 460, the analog group signals $S_{Gk}$ are combined to the analog signal $S_A$ (426). The analog signal $S_A$ can be, for example, the total sum $I_{TOTAL}$ of sum currents $I_{Sk}$.

For example, converter block $401_k$ can be a converter block 200 or 101 as explained in connection with FIGS. 3 and 4. As an example, FIG. 6 also shows a possible configuration of converter block $401_k$. Converter block $401_k$ comprises bank $430_k$, steering circuit $450_k$, optional code converter $410_k$, and optional dynamic matching circuit $480_k$.

The function of converter block $401_k$ in FIG. 6 is the same as described for converter block 200 in FIG. 4. Reference numerals $210/410_k$, $300/480_k$, $230/430_k$, $250/450_k$ refer to corresponding components and signals.

Converter block $401_k$ can be coupled to other converter blocks $401_x$ as for example, to adjacent converter block $401_{k+1}$. The cascading of bank $430_k$ with bank $430_{k-1}$ via steering circuits $450_k$, $450_{k-1}$ for providing reference currents $I_{ref}$ will be explained in connection with FIG. 8.

According to the invention some units can be left out, and hardware can be reduced. For example, code converter $410_k$ can be left out. In this case, input $411_k$ is directly connected to input $485_k$ of dynamic matching circuit $480_k$ or to control inputs $457_{ki}$ of the switches of steering circuit $450_k$.

In FIG. 6, the possibility of leaving out units is indicated by dashed lines through them.

An example of a possible configuration of converter 400 is shown in TABLE 3. It comprises converter block $401_1$, $401_2$ and $401_3$. Digital signal $S_N$ has N=20 bits $w_i$. The corresponding analog signal $S_A$ is a voltage $$V_{out}=\alpha*(w_0+w_1*2+w_i*2^i+\ldots+w_{N-1}*2^{N-1}).$$

The digital signal $S_N$ is split up into G=3 digital group signals $S_{N1}, S_{N2}, S_{N3}$. Analog group signals $S_{G1}, S_{G2}, S_{G3}$ ($I_{S1}$, $I_{S2}$, $I_{S3}$) are generated in converter block $401_1, 401_2, 401_3$. In summation circuit 460, sum currents $I_{S1}$, $I_{S2}$, $I_{S3}$ are added and converted to $V_{out}$ of the analog signal $S_A$.

TABLE 3

| i of $w_i$ | k $N_k$ | code converter 410$_k$ | dynamic matching circuit 480$_k$ | bank 430$_k$ |
|---|---|---|---|---|
| 12 ... 19 | 3 $N_3 = 8$ | as 210 in FIG. 4 thermometer code | as 300 in FIG. 4 | monotonic $I_i$ constant |
| 8 ... 11 | 2 $N_2 = 4$ | not available | not available | binary weighted $I_{i+1} = 2*I_i$ |
| 0 ... 7 | 1 $N_1 = 8$ | as 210 in FIG.4 thermometer code | not available | monotonic $I_i$ constant |

Figure 8:
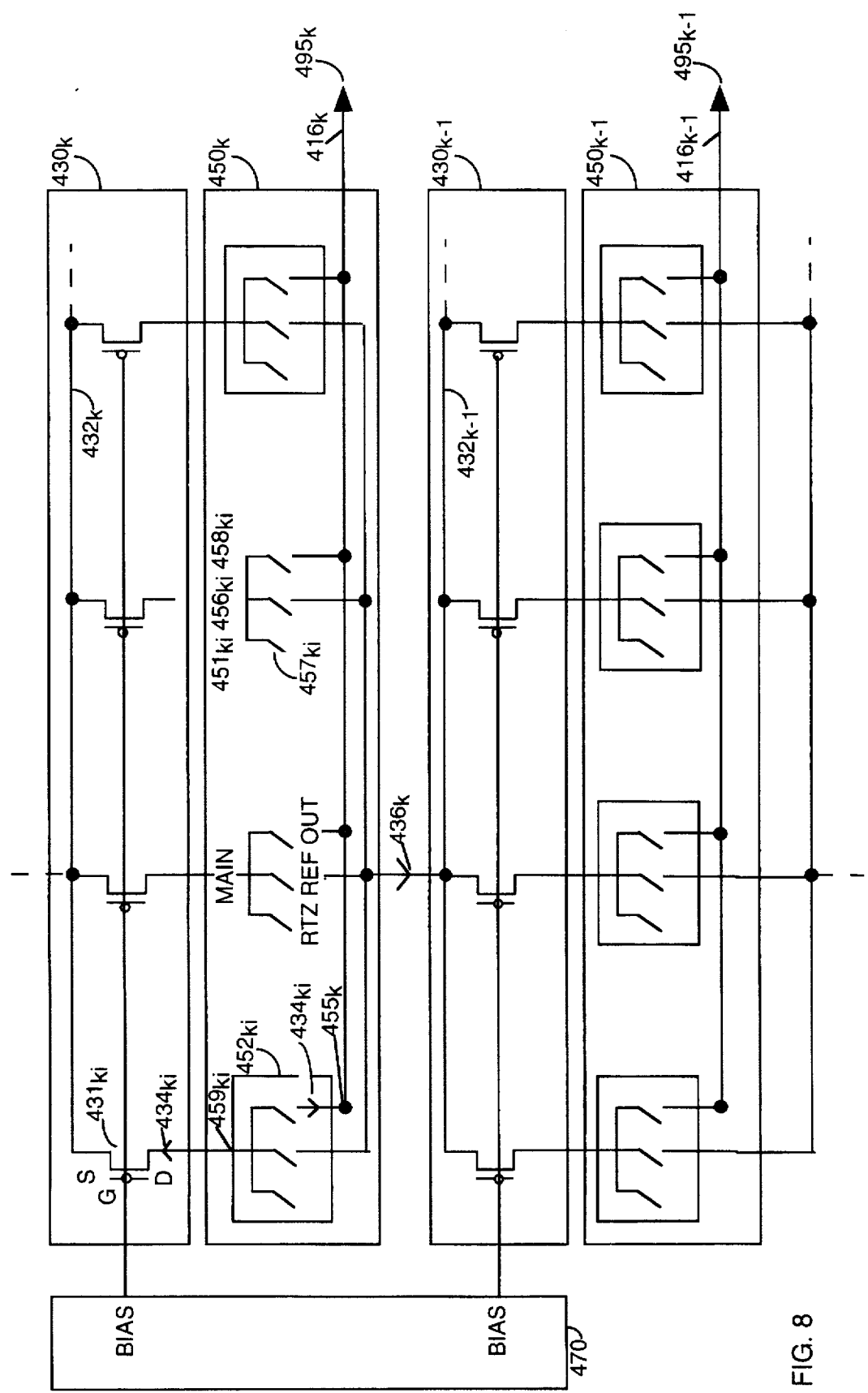
FIG. 8 shows a circuit diagram with more details of the converter blocks ($401_k$) of FIG. 6.

FIG. 8 shows a circuit diagram of steering circuit 450$_k$, 450$_{k-1}$ and bank 430$_k$, 430$_{k-1}$, with more details. Bank 430$_k$ comprises m field effect transistors (FETs) 431$_{ki}$ acting as current sources to generate $I_i$ (434k$_{ki}$). The sources (S) of FETs 431$_{ki}$ are coupled to power terminal 432$_k$. The gates (G) of FETs 431$_{ki}$ are coupled to reference circuit 470 which provides bias.

Steering circuit 450$_k$ comprises m switches 452$_{ki}$ having terminals MAIN (459$_{ki}$), OUT (458$_{ki}$), REF (456$_{ki}$), and RTZ (451$_{ki}$) and actuator 457$_{ki}$. Every switching element 452$_{ki}$ has switches coupled between terminal MAIN and terminal OUT, REF, RTZ. Actuator 457$_{ki}$ can be coupled to dynamic matching circuit 480$_k$ and activated by control bits b$_i$.

The drains (D) of FETs 431$_{ki}$ are coupled to MAIN. OUT is coupled to node 455$_k$ with output 495$_k$. REF is coupled to power terminal 432$_{k-1}$ of adjacent bank 430$_{k-1}$. RTZ (return-to-zero) symbolizes a tristate option.

At OUT, currents $I_i$ (434$_{ki}$) are coupled to node 455$_k$ by control bits b$_i$ of control signal $S_C$. The sum current $I_{Sk}$ is created which represents analog group signal $S_{Gk}$ (416$_k$).

Via REF, control bits b$_i$ can also switch currents $I_i$ to reference current $I_{Ref}$ (436$_k$) which is fed to power terminal 432$_{k-1}$ of adjacent bank 430$_{k-1}$.

Figure 9:
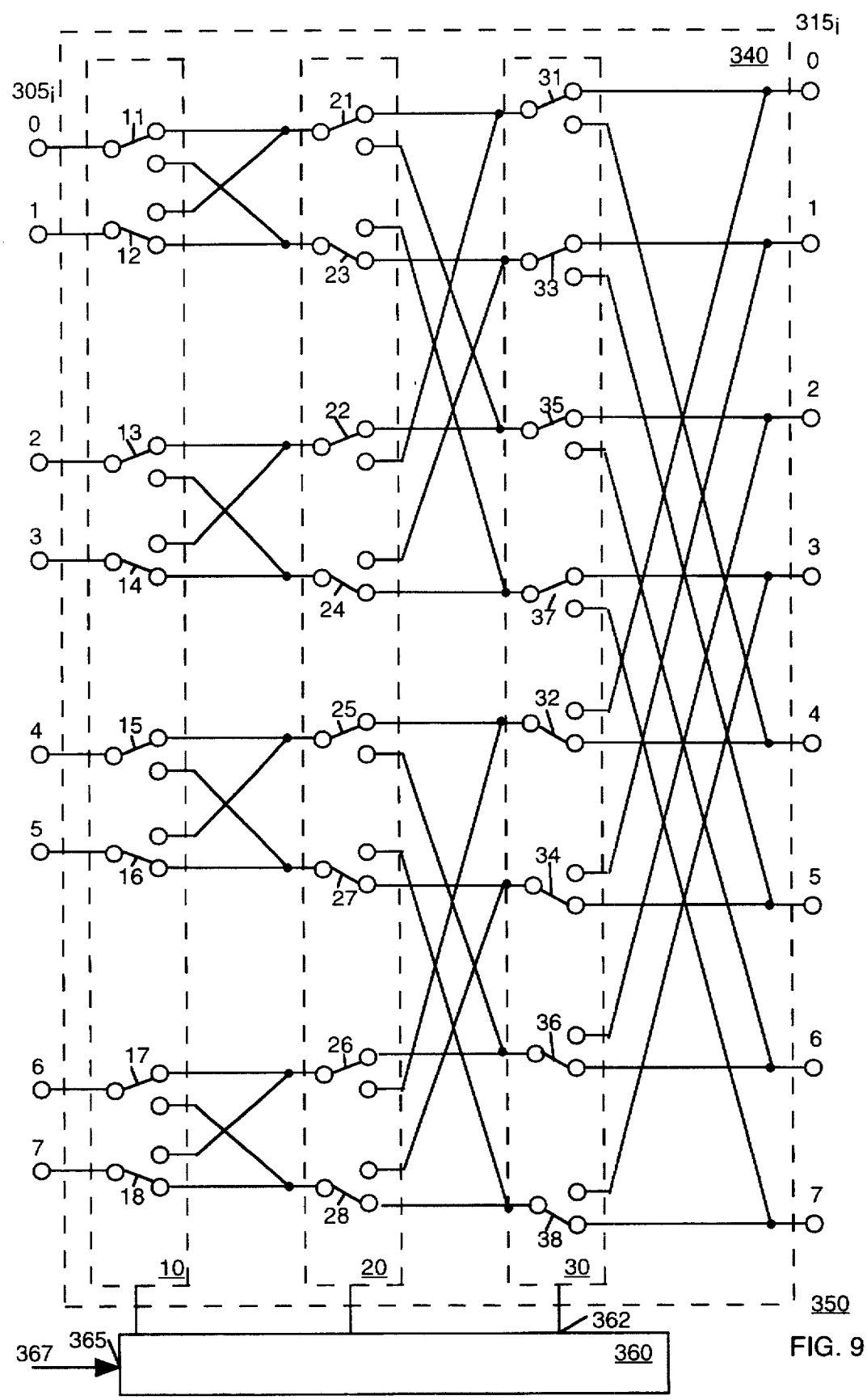
FIG. 9 shows a simplified schematic diagram of an alternative dynamic matching circuit (350) as it can be used in converter blocks (200, $401_k$) of FIGS. 4 and 5.

FIG. 9 shows a dynamic matching circuit 350 as it can be used in converter blocks 200 and 401 instead of dynamic matching circuits 300 and 480. It has the same inputs 305$_i$ and outputs 315$_i$ as dynamic matching circuit 300 of FIG. 4. For convenience of explanation and not intended to be limiting, dynamic matching circuit 350 has n=8 inputs 305$_i$ and n=8 outputs 315$_i$. Dynamic matching circuit 350 further comprises switch network 340 and control unit 360. Control unit 360 can have control input 365 for receiving logic control signal $S_{LC}$ (367). Switch network 340 has a 3*8=24 switches 11 ... 38. Switches 11 ... 18 belong to structure 10, switches 21 ... 28 to structure 10, and switches 31 .. . 38 to structure C. Switches 11 ... 38 are coupled to outputs 362$_i$ of control unit 360. In FIG. 9, these connections are symbolized by lines from outputs 362$_i$ of control unit 360 to structures 10, 20, 30. In the example for $2^3=8$ or $2^k=n$, the number of switches 11 ... 38 is 12. In general, there are k structures with a total number of 2**k switches. Dynamic matching circuit 350 can reroute the code bits a$_i$ from input 305$_i$ to output 315$_i$. For dynamic matching circuit 350 with an equal number of inputs 305$_i$ and outputs 315$_i$, at one time every input 305$_i$ is coupled to one output 315$_i$. Switches 11 ... 38 are activated by control unit 360 and can reroute code bits a$_i$. In FIG. 9, switches 11 ... 38 are shown as not activated.

Control unit 360 can be a pseudo random number generator with, for example, 12 outputs 362$_i$. Two switches with consecutive odd and even numerals are coupled to switch at the same time. They form the following switch pairs: 11/12, 13/14, 15/16, 17/18, 21/22, 23/24, 25/26, 27/28, 31/32, 33/34, 35/36 and 37/38. Each of these twelve switch pairs is coupled to an output 362$_i$ of control unit 360. For example, control unit 360 generates a 12 bit random number which is available at outputs 362$_i$. This random number stands for $2^{12}=4096$ possible rerouting configurations. The mismatch between current sources 231 such as in converter block 200 of FIG. 4 is converted into a white noise signal which can be subsequently filtered out.

In a different version, the number of outputs 362 of control unit 360 equals the number of structures 10,20,30 in switch network 340. Switches of one structure 10, 20, 30 are coupled to one output 362 so that they switch at the same time.

Switches 11 ... 18 of structure 10, switches 21 ... 28 of structure 10, and switches 31 ... 38 of structure 10 are coupled to three outputs 362. The top four code bits a$_i$ can be swapped with the bottom four code bits a$_i$ by structure 30. Two code bits a$_i$ can be swapped with two code bits a$_i$ by structure 20. Adjacent code bits a$_i$ can be swapped by structure 10. The swapping method has been introduced in a number of publications as, e.g. in U.S. Pat. No. 5,406,283.

It should be well understood that converter 100, 400 may be implemented in a variety of semiconductor technologies, including metal oxide semiconductor (MOS), bipolar, BiMOS, gallium arsenide, and others.

It will be appreciated that although only one particular embodiment of the invention has been described in detail, various modifications and improvements can be made by a person skilled in the art based on the teachings herein without departing from the scope of the present invention.

We claim:

1. A digital-to-analog converter for converting a digital signal having $N_1+N_2$ bits, where $N_1$ and $N_2$ are integers, to an analog signal, comprising:

a signal divider for receiving the digital signal and splitting it up into a first digital group signal of $N_1$ least significant bits (LSB) and a second digital group signal of $N_2$ most significant bits (MSB);

a first and a second converter block coupled to said signal divider for receiving the first digital signal group signal and the second digital group signal and generating a corresponding first analog group signal and a corresponding second analog group signal, wherein only said second converter block further comprises a dynamic matching circuit which acts on said second digital group signal; and a summation circuit coupled to said first and second converter blocks for receiving the first and the second analog group signals and generating the analog signal.

2. The digital-to-analog converter of claim 1 wherein said first converter block provides said first analog group signal without an attenuator.

3. A digital-to-analog converter for converting a digital signal having N bits to an analog signal, comprising:

a signal divider for receiving the digital signal and splitting it up into a number of G digital group signals with in total N bits;

a number of G converter blocks coupled to said signal divider for receiving the digital group signals and converting them into analog group signals, adjacent converter blocks being coupled so that a first converter provides a reference value to a second converter; and a summation circuit coupled to said converter blocks for receiving the analog group signals and combining them into the analog signal.

4. A method for the conversion of a digital signal having $N_1+N_2$ bits to an analog signal comprising the steps of:

receiving the digital signal and splitting it up into a first digital group signal of $N_2$ bits and a second digital group signal of $N_1$ bits;

converting the first digital group signal to a first analog group signal;

converting the second digital group signal to a second analog group signal by using reference values which have been generated in the step of converting the first digital group signal; and combining the first and the second analog group signal to the analog signal.

5. The method for conversion of claim 4 wherein said step of receiving and splitting comprises having the first digital group signal include the most significant bits and the second group signal include the least significant bits.

6. A method for the conversion of a N bit digital signal to an analog signal comprising the steps of:

receiving the digital signal and splitting it up into digital group signals, each digital group signal comprising a number of bits;

converting each of the digital group signals to an analog group signal, thereby converting only a first digital group signal with dynamic matching to provide a reference signal which is used for converting a second digital group signal; and combining the analog group signals to form the analog signal.

7. The method for conversion of claim 6 wherein in said converting step, different digital group signals are converted by different conversion methods, said conversion methods being selected according the significance of the bits of the digital group signals, whereby only the digital group signals with most significant bits are dynamically matched.

8. An apparatus for converting a digital signal having most significant bits (MSB) and least significant bits (LSB) to a single analog signal, said apparatus comprising:

a first array of switches for providing first currents, said first array of switches controlled by said MSB and by a dynamic matching circuit for providing a first analog intermediate signal and for providing a reference signal;

a second array of switches for providing second currents, said second array of switches controlled by said LSB and receiving said reference signal for providing a second analog intermediate signal; and a combiner receiving said first and second analog intermediate signals and providing said single analog signal.

9. The apparatus of claim 8 wherein said dynamic matching circuit has a switching network controlled by a pseudo random generator.

10. The apparatus of claim 8 wherein said dynamic matching circuit employs a barrel shifter having an input receiving said MSB in thermometer code form and having an output providing control bits for controlling said switches.

11. An apparatus for converting digital group signals to a single analog signal, said apparatus comprising:

a plurality of converter blocks each receiving a digital group signal and providing an analog group signal, at least one of said converter blocks having a dynamic matching circuit which provides a reference signal for a neighboring converter block; and a summation circuit receiving said analog group signals and combining them to said single analog signal.

* * * * *